(12) United States Patent
Hasegawa et al.

(10) Patent No.: US 8,548,024 B2
(45) Date of Patent: Oct. 1, 2013

(54) SEMICONDUCTOR LASER MODULE

(75) Inventors: Hideaki Hasegawa, Tokyo (JP);
Tatsuya Kimoto, Tokyo (JP); Go Kobayashi, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 13/280,709

(22) Filed: Oct. 25, 2011

(65) Prior Publication Data

US 2012/0207187 A1   Aug. 16, 2012

(30) Foreign Application Priority Data

Feb. 15, 2011   (JP) .................................. 2011-030199

(51) Int. Cl.
*H01S 5/00*   (2006.01)

(52) U.S. Cl.
USPC ................ 372/50.121; 372/50.12; 372/50.11; 372/50.1; 372/50.21; 372/50.22; 372/50.23

(58) Field of Classification Search
USPC .......... 372/50.121, 50.12, 50.11, 50.1, 50.21, 372/50.22, 50.23
See application file for complete search history.

(56) References Cited

U.S. PATENT DOCUMENTS

| | | | |
|---|---|---|---|
| 2008/0024788 A1* | 1/2008 | Shimizu et al. | 356/497 |
| 2008/0025349 A1* | 1/2008 | Mizutani et al. | 372/20 |
| 2009/0310630 A1* | 12/2009 | Takabayashi | 372/20 |
| 2012/0128375 A1* | 5/2012 | Kimoto et al. | 398/201 |

FOREIGN PATENT DOCUMENTS

| | | |
|---|---|---|
| JP | 4444368 B1 | 3/2010 |
| WO | 2011-013480 A1 | 2/2011 |

* cited by examiner

*Primary Examiner* — Kinam Park
(74) *Attorney, Agent, or Firm* — Lowe Hauptman & Ham, LLP

(57) ABSTRACT

A semiconductor laser module includes a semiconductor laser unit and a light selecting unit. The semiconductor laser unit includes a semiconductor laser substrate and a plurality of distributed reflector semiconductor laser devices formed on the semiconductor laser substrate in an array. Each of the distributed reflector semiconductor laser devices is configured to emit a laser light of a different wavelength from an output facet. The light selecting unit includes a light selecting device substrate and a light selecting device formed on the light selecting device substrate. The light selecting device is configured to selectively output a laser light emitted from a distributed reflector semiconductor laser device. The semiconductor laser unit and the light selecting unit are attached to each other in such a manner that the light selecting device is optically coupled to the distributed reflector semiconductor laser devices.

20 Claims, 7 Drawing Sheets

SEMICONDUCTOR LASER MODULE

RELATED APPLICATIONS

This application is based upon and claims the benefit of priority from Japanese Patent Application No. 2011-30199, filed Feb. 15, 2011, the entire contents of which are incorporated herein by reference.

BACKGROUND OF THE INVENTION

1. Field of the Invention

The present invention relates to a semiconductor laser module that includes a semiconductor laser device and an optical module including the semiconductor laser module.

2. Description of the Related Art

An integrated semiconductor laser module has been known, for example, as a tunable light source for the dense wavelength division multiplexing (DWDM) optical communication (see, for example, Japanese Patent No. 4444368).

The integrated semiconductor laser module described in the above Patent Document is obtained by integrating a plurality of distributed feedback (DFB) semiconductor laser devices each having a different oscillation wavelength, a plurality of optical waveguides, a multimode interference (MMI) optical coupler, and a semiconductor optical amplifier (SOA) on a single substrate. In this integrated semiconductor laser module, when one of the semiconductor laser devices is driven, a laser light output from the semiconductor laser device is guided through an optical waveguide that is optically coupled to the semiconductor laser device. The laser light guided through the optical waveguide is then passed through the MMI optical coupler and output from an output port. The SOA amplifies the laser light output from the output port and outputs an amplified laser light from an output facet. This integrated semiconductor laser module is used, for example, as an optical transmitter in combination with an external optical modulator, for a long-haul optical transmission in a DWDM optical communication network system.

However, when a λ/4 phase-shifted DFB semiconductor laser device is used as the semiconductor laser device in the integrated semiconductor laser module having the above configuration, about a half of the optical output is emitted from a rear facet of the semiconductor laser device, resulting in a degradation of the efficiency and an increase of the power consumption. Furthermore, when the number of channels of the MMI optical coupler is n, the optical output of the semiconductor laser device is decreased to 1/n of its original output power at the MMI optical coupler. For this reason, with the configuration of the integrated semiconductor laser module employing the MMI optical coupler, the optical loss is considerably high at the MMI optical coupler, and the optical output of the entire module eventually depends on an output characteristic of the SOA. Therefore, even if the output of each semiconductor laser device is increased by using a DFB semiconductor laser device structure with which a high output power is obtained from a front facet that is an output side of the module, which will be described later, the optical output of the entire module is not improved as expected because there is a loss of the optical output at the MMI optical coupler. Because of these factors, it has been expected to provide an integrated semiconductor laser module with which the high efficiency and the high output power can be achieved.

SUMMARY OF THE INVENTION

According to an embodiment of the present invention, there is provided a semiconductor laser module including a semiconductor laser unit and a semiconductor laser substrate. The semiconductor laser module includes a semiconductor laser substrate and a plurality of distributed reflector (DR) semiconductor laser devices formed on the semiconductor laser substrate in an array. Each of the DR semiconductor laser devices is configured to emit a laser light of a different wavelength from an output facet. The light selecting unit includes a light selecting device substrate and a light selecting device formed on the light selecting device substrate. The light selecting device is configured to selectively output a laser light emitted from a distributed reflector semiconductor laser device. The semiconductor laser unit and the light selecting unit are attached to each other in such a manner that the light selecting device is optically coupled to the distributed reflector semiconductor laser devices.

According to another embodiment of the present invention, there is provided an optical module including a semiconductor laser module configured to emit a laser light, a collimating lens configured to collimate the laser light emitted from the semiconductor laser module, a focusing lens configured to focus the laser light collimated by the collimating lens, and an optical fiber that is optically coupled to the focusing lens, through which the laser light focused by the focusing lens propagates. The semiconductor laser module includes a semiconductor laser unit including a semiconductor laser substrate and a plurality of DR semiconductor laser devices formed on the semiconductor laser substrate, each being configured to emit a laser light of a different wavelength from an output facet and a light selecting unit including a light selecting device substrate and a light selecting device formed on the light selecting device substrate, which is configured to selectively output a laser light emitted from a distributed reflector semiconductor laser device. The semiconductor laser unit and the light selecting unit are attached to each other in such a manner that the light selecting device is optically coupled to the distributed reflector semiconductor laser devices.

The above and other objects, features, advantages and technical and industrial significance of the present invention will be better understood by reading the following detailed description of exemplary embodiments of the present invention, when considered in connection with the accompanying drawings.

DETAILED DESCRIPTION OF THE PREFERRED EMBODIMENTS

Exemplary embodiments of the present invention will be explained in detail below with reference to the accompanying drawings.

Figure 1:
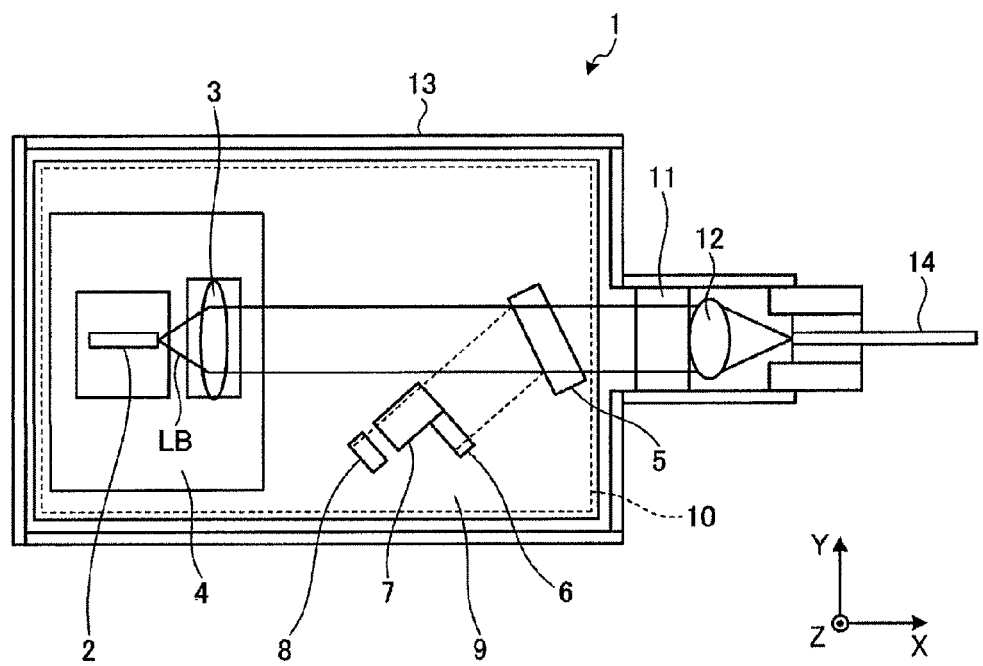
FIG. 1 is a schematic cross section of an optical module according to an embodiment of the present invention viewed from above.

FIG. 1 is a schematic cross section of an optical module 1 according to an embodiment of the present invention viewed from above. In the following explanation, an emission direction of a laser light (i.e., optical axis direction) in a level plane is defined as the X-axis direction, a direction perpendicular to the X-axis direction in the level plane is defined as the Y-axis direction, and a normal line direction (vertical direction) to the XY plane (level plane) is defined as the Z-axis direction.

As shown in FIG. 1, the optical module 1 includes a semiconductor laser module 2, a collimating lens 3, a substrate 4, a beam splitter 5, a power monitor photodiode 6, an etalon filter 7, a wavelength monitor photodiode 8, a base plate 9, a temperature control device 10, an optical isolator 11, and a focusing lens 12, all accommodated in a case 13.

The collimating lens 3 is arranged in vicinity of a laser-light output facet of the semiconductor laser module 2. The collimating lens 3 collimates a laser light LB output from the semiconductor laser module 2 to convert the laser light LB into a collimated light, and guides the collimated laser light LB to the beam splitter 5. The substrate 4 is arranged such that the semiconductor laser module 2 and the collimating lens 3 are arranged on its level plane that is parallel to the XY plane.

The beam splitter 5 splits the laser light LB that is guided by the collimating lens 3 into a first part and a second part, transmits the first part of the laser light LB to guide it to the optical isolator 11, and reflects the second part of the laser light LB to the power monitor photodiode 6 side and the etalon filter 7 side. The power monitor photodiode 6 detects an intensity of the laser light LB that is split by the beam splitter 5, and inputs an electrical signal corresponding to the detected intensity to a control unit (not shown).

The etalon filter 7 has a periodic transmission characteristic with respect to the laser light LB, selectively transmits the laser light LB with an intensity according to the transmission characteristic, and inputs the selectively transmitted laser light LB to the wavelength monitor photodiode 8. The wavelength monitor photodiode 8 detects an intensity of the laser light LB input from the etalon filter 7, and inputs an electrical signal corresponding to the detected intensity to the control unit (not shown). The intensities of the laser lights LB detected by the power monitor photodiode 6 and the wavelength monitor photodiode 8 are used for a wavelength locking control by the control unit (not shown).

Specifically, in the wavelength locking control, the control unit (not shown) controls an operation of the semiconductor laser module 2 in such a manner that a ratio of the intensity of the laser light LB detected by the power monitor photodiode 6 and the intensity of the laser light LB detected by the wavelength monitor photodiode 8 becomes a desired ratio with which the intensity and wavelength of the laser light LB becomes target intensity and wavelength. With this mechanism, it is possible to control the intensity and wavelength of the laser light LB to be desired intensity and wavelength.

The base plate 9 is arranged such that the substrate 4, the beam splitter 5, the power monitor photodiode 6, the etalon filter 7, and the wavelength monitor photodiode 8 are arranged on its level plane that is parallel to the XY plane. The temperature control device 10 is arranged such that the base plate 9 is arranged on its level plane that is parallel to the XY plane, to control a temperature of the etalon filter 7 via the base plate 9, thus controlling a selection wavelength of the etalon filter 7. A Peltier element (thermo-electric cooler (TEC)) can be used as the temperature control device 10, for example. The optical isolator 11 prevents a back-reflected light from a fiber 14 from recoupling to the laser light LB. The focusing lens 12 couples the laser light LB passed through the beam splitter 5 into the fiber 14.

Figure 2A:
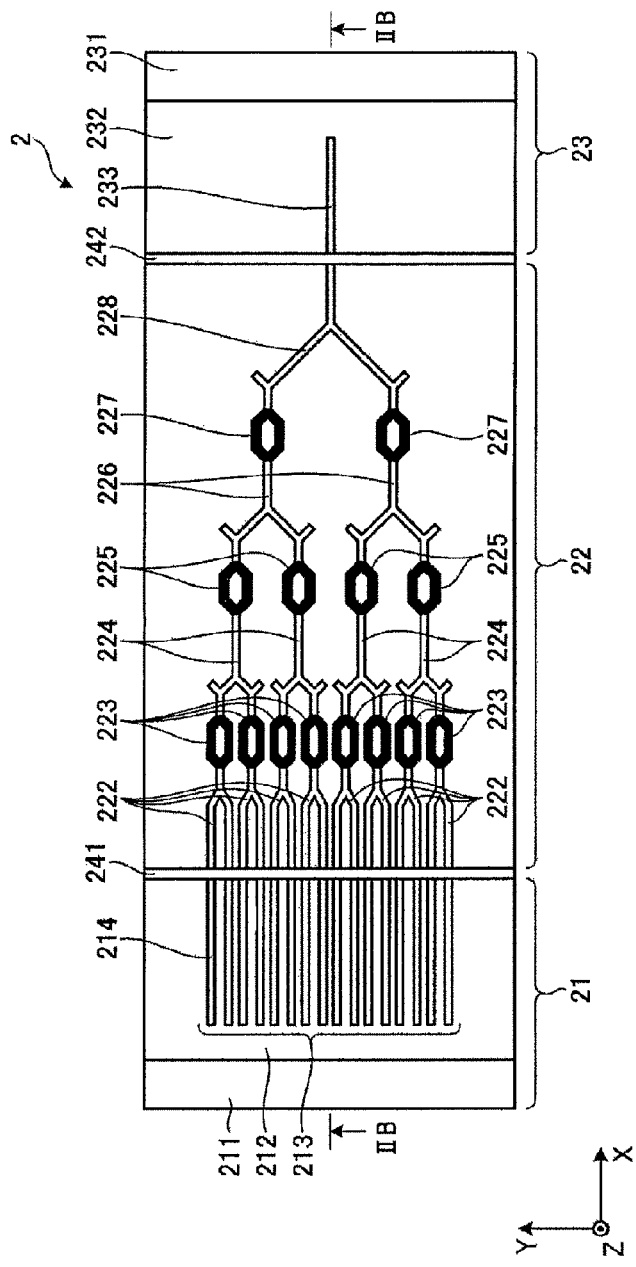
FIG. 2A is a top plan view of a semiconductor laser module shown in FIG. 1.
Figure 2B:
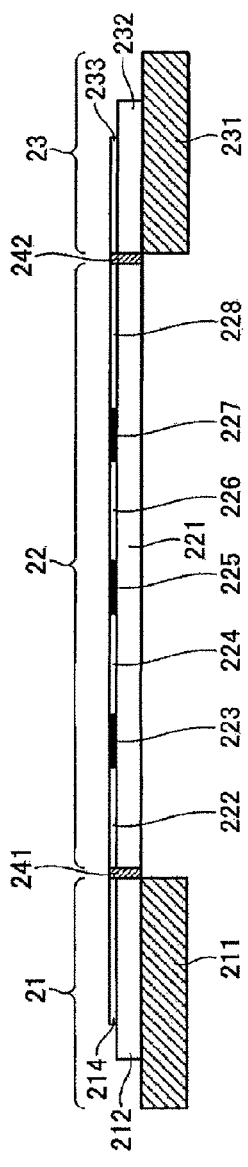
FIG. 2B is a cross section of the semiconductor laser module cut along a line IIB-IIB shown in FIG. 2A.

FIG. 2A is a top plan view of the semiconductor laser module 2 shown in FIG. 1, and FIG. 2B is a cross section of the semiconductor laser module 2 cut along a line IIB-IIB shown in FIG. 2A. As shown in FIGS. 2A and 2B, the semiconductor laser module 2 includes a semiconductor laser unit 21, a light selecting device unit 22, and an amplifying unit 23.

The semiconductor laser unit 21 includes a temperature control device 211, a semiconductor laser substrate 212 attached on the temperature control device 211, and a semiconductor laser array 213 formed on the semiconductor laser substrate 212. The temperature control device 211 controls a temperature of the semiconductor laser array 213 via the semiconductor laser substrate 212 based on a control signal from the control unit (not shown). A Peltier element can be used as the temperature control device 211, for example. The semiconductor laser array 213 includes a plurality of single longitudinal-mode semiconductor laser devices in a stripe shape (hereinafter, "semiconductor laser devices") 214 (16 devices in the present example) each emitting a laser light of a different wavelength from its output facet.

Each of the semiconductor laser devices 214 can tune its oscillation wavelength in a range of, for example, about 3 nanometers to 4 nanometers, and the oscillation wavelengths of the semiconductor laser devices 214 are designed to be arranged with an interval of 3 nanometers to 4 nanometers. With this arrangement, the semiconductor laser array 213 can output the laser light LB in a continuous wavelength band that is much broader than that of a single semiconductor laser device by switching the semiconductor laser devices 214 to be driven and controlling the device temperature.

In order to cover an entire wavelength band for the WDM communication (for example, the C-band from 1.53 micrometers to 1.56 micrometers or the L-band from 1.565 micrometers to 1.625 micrometers), it is possible to tune the wavelength across a wavelength band of 30 nanometers or broader by integrating 10 or more semiconductor laser devices 214 each being capable of tuning the oscillation wavelength in a range of 3 nanometers to 4 nanometers.

The light selecting device unit 22 includes a light selecting device substrate 221 and optical waveguides 222, 224, 226, and 228 and Mach-Zehnder interferometer (MZI) devices 223, 225, and 227 formed on the light selecting device substrate 221. The light selecting device substrate 221 is attached to the semiconductor laser substrate 212 with an ultraviolet (UV) curing resin 241 that is transparent with respect to the wavelength of the laser light. An acrylic resin, an epoxy resin, and a polyester resin e.g. can be used as the UV curing resin 241. The optical waveguides 222 are optically coupled to the output facets of the semiconductor laser devices 214, respectively, via the UV curing resin 241. The optical waveguide 222 guides the laser light output from the semiconductor laser device 214 to the MZI device 223. Each of the MZI devices 223 is optically coupled to two adjacent optical waveguides 222, and selectively outputs a laser light guided through one of the two optical waveguides 222.

The optical waveguide 224 guides the laser light output from the MZI device 223 to the MZI device 225. The MZI device 225 is optically coupled to the optical waveguide 224, and selectively outputs the laser light guided through the optical waveguide 224. The optical waveguide 226 guides the laser light output from the MZI device 225 to the MZI device 227. The MZI device 227 is optically coupled to the optical waveguide 226, and selectively outputs the laser light guided through the optical waveguide 226. The optical waveguide 228 guides the laser light output from the MZI device 227 to the amplifying unit 23. In this manner, the light selecting device unit 22 is made up with a MZI light selective device formed of a 16 input-to-1 output planar lightwave circuit (PLC), and selectively outputs the laser light output from a plurality of semiconductor laser devices 214 (16 devices in the present example). Because the light selecting device is employed, there is no such a loss as the optical output being decreased to 1/n of the original output power, compared to a case of employing the MMI optical coupler. The light selecting device unit 22 is not limited to the PLC MZI light selecting device, but can be any other type of light selecting device, such as a micro electro mechanical systems (MEMS) optical switch, a semiconductor optical switch, and a Si microstrip optical switch.

The amplifying unit 23 includes a temperature control device 231, an amplifier substrate 232 attached on the temperature control device 231, and a semiconductor optical amplifier (SOA) 233 formed on the amplifier substrate 232. The temperature control device 231 controls a temperature of the semiconductor optical amplifier 233 via the amplifier substrate 232 based on a control signal from the control unit (not shown). A Peltier element can be used as the temperature control device 231, for example. The amplifier substrate 232 is attached to the light selecting device substrate 221 with a UV curing resin 242. The SOA 233 is optically coupled to the optical waveguide 228 via the UV curing resin 242. The SOA 233 amplifies the laser light guided through the optical waveguide 228, and outputs the amplified laser light in the X-axis direction.

When manufacturing the semiconductor laser module 2 having the above configuration, firstly, the semiconductor laser array 213 is formed on the semiconductor laser substrate 212, and the light selecting device that selectively outputs the laser light output from the semiconductor laser array 213 is formed on the light selecting device substrate 221. Subsequently, the SOA 233 that amplifies the laser light selectively output by the light selecting device is formed on the amplifier substrate 232. The semiconductor laser substrate 212 and the light selecting device substrate 221 are then attached to each other with the UV curing resin 241 in such a manner that the output facet of the semiconductor laser array 213 and the light selecting device are optically coupled to each other, and the light selecting device substrate 221 and the amplifier substrate 232 are attached to each other with the UV curing resin 242 in such a manner that the light selecting device and the SOA 233 are optically coupled to each other. Finally, the semiconductor laser substrate 212 is attached onto the temperature control device 211 that controls the temperature of the semiconductor laser array 213, and the amplifier substrate 232 is attached onto the temperature control device 231 that controls the temperature of the SOA 233.

In the present embodiment, it is configured that the operating temperature of the semiconductor laser devices 214 and the operating temperature of the SOA 233 are respectively controlled by the temperature control devices 211 and 231 in an independent manner. However, it can be also configured that the operating temperature of the semiconductor laser devices 214 and the operating temperature of the SOA 233 are controlled by a common temperature control device.

Figure 3:
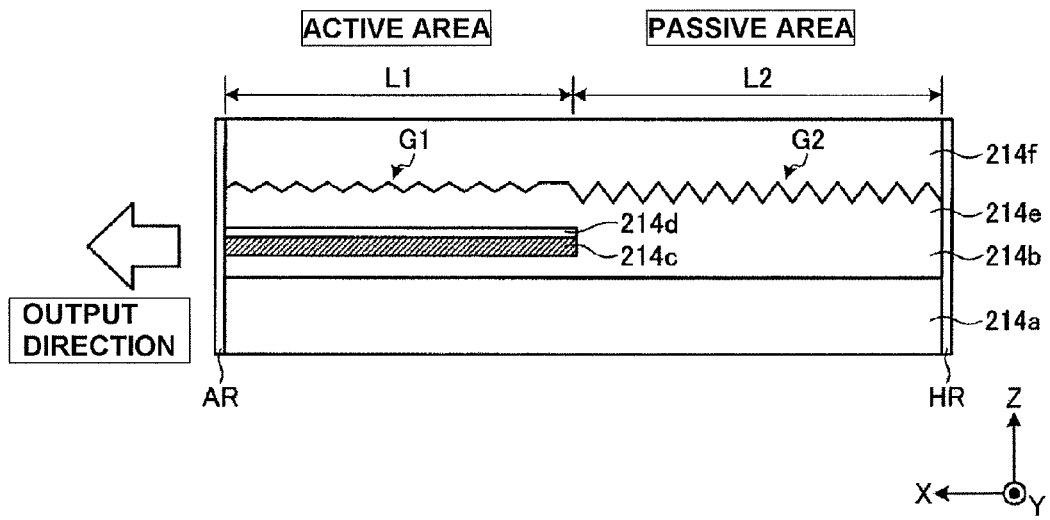
FIG. 3 is a cross section of an example of a semiconductor laser device shown in FIG. 2A.

FIG. 3 is a cross section of an example of the semiconductor laser device 214 shown in FIG. 2A. The semiconductor laser device 214 according to the embodiment is made up with a distributed reflector (DR) semiconductor laser device that emits a laser light in the forward direction. Specifically, as shown in FIG. 3, the semiconductor laser device 214 includes a cladding layer 214a, a lower waveguide layer 214b and an upper waveguide layer 214e formed on the cladding layer 214a, an active layer 214c and a depression layer 214d sandwiched by the lower waveguide layer 214b and the upper waveguide layer 214e, and a cladding layer 214f formed on the upper waveguide layer 214e. An antireflection film AR and a high-reflection film HR are respectively formed on both facets of the semiconductor laser device 214 in the X-axis direction. The semiconductor laser device 214 emits a laser light from the antireflection film AR side, which is the front facet corresponding to the forward direction.

Figure 4:
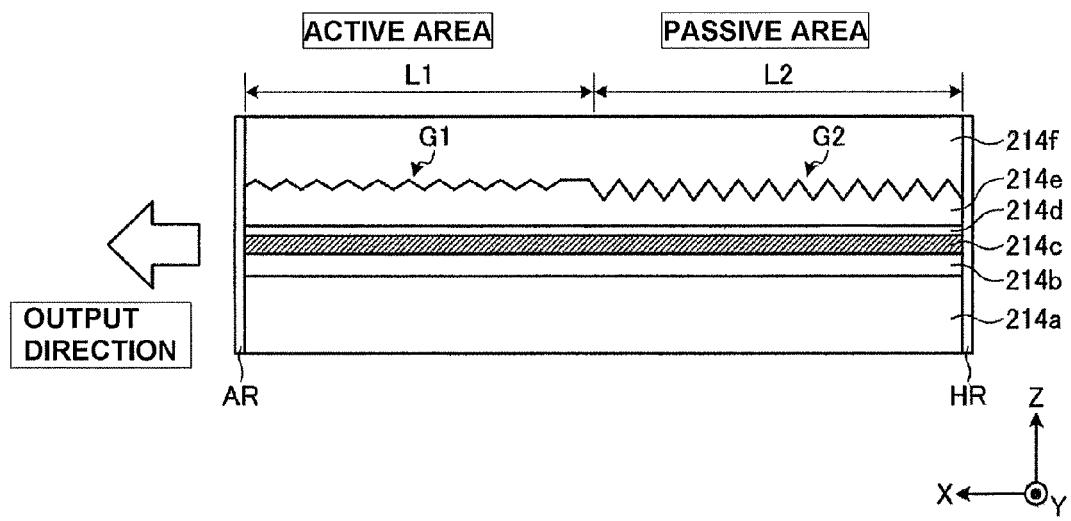
FIG. 4 is a cross section of a modification example of the semiconductor laser device shown in FIG. 3.

On the upper waveguide layer 214e, a grating is formed across an active area and a passive area with the same pitch. Coupling coefficients of the active area and the passive area are controlled by making an etching depth of a grating G1 in the active area and an etching depth of a grating G2 in the passive area different from each other. The active layer 214c and the depression layer 214d can also be formed across the active area and the passive area, as shown in FIG. 4.

In this case, it is desirable to satisfy following Expression (1) in order to achieve a low threshold gain and a stable single-mode operation:

$$\kappa_1 L1 < \kappa_2 L2 \qquad (1),$$

where $\kappa_1$ is coupling coefficient of the active area, L1 is length of the active area, $\kappa_2$ is coupling coefficient of the passive area, and L2 is length of the passive area.

Furthermore, it is desirable to satisfy following Expression (2) in order to achieve the minimum threshold gain and the maximum side-mode suppression ratio (SMSR):

$$\beta_1 - \beta_2 = \delta\beta_{12} < 1.5\kappa_2, \Phi_{SH} = \pi/2 \qquad (2),$$

where $\phi_{SH}$ is phase shift, $\beta_1$ is propagation coefficient of the active area, and $\beta_2$ is propagation coefficient of the passive area.

In addition, it is desirable that the phase shift $\phi_{SH}$, the propagation coefficient $\beta_1$ of the active area, and the propagation coefficient $\beta_2$ of the passive area also satisfy following Expression (3) in order to reduce the effective linewidth enhancement factor $\alpha_{eff}$. It is desirable to control the coupling coefficients of the active area and the passive area to satisfy these conditions in achieving single-mode characteristic, high efficiency, and narrow linewidth laser characteristic. For details on these conditions and a method of manufacturing the DR semiconductor laser device, see J. Shim, et al., "Lasing Characteristics of 1.5 μm GaInAsP—InP SCH-BIG-DR Lasers", IEEE Journal of Quantum Electronics, vol. 27, no. 6, pp. 1736-1745, June 1991".

$$\beta_1 > \beta_2, \pi/2 < \Phi_{SH} < \pi \qquad (3)$$

By satisfying Expression (3), it is possible to reduce the optical spectral linewidth to 1/5 of the linewidth of a DFB semiconductor laser device. Furthermore, in the case of a typical DFB semiconductor laser device, it has been known that an intensity noise increases when a reflection at a facet is −30 dB or higher. However, in the case of a DR semiconductor laser device, because it is configured with a DR type mirror having a high reflectivity, the intensity noise does not increase even when there is a reflected light up to −10 dB. In a configuration having a large number of reflection points, such as coupling with a material that is different from the semiconductor, e.g., the PLC, the DR semiconductor laser device having a reflection-resistant characteristic is more suitable.

When a MEMS optical switch is used as the light selecting device unit 22, it dispenses with a spot size converter (SSC) on the semiconductor laser devices 214 side because the MEMS optical switch is optically coupled to the semiconductor laser devices 214 with a lens. Similarly, when a semiconductor optical switch is used as the light selecting device unit 22, it dispenses with the SSC because the semiconductor laser devices 214 and the light selecting device unit 22 have the same waveguide width. However, when a Si microstrip optical switch or a PLC MZI light selecting device is used as the light selecting device unit 22, it is desirable to integrate a SSC of a flare type or a taper type on the semiconductor laser devices 214 side.

Figure 5:
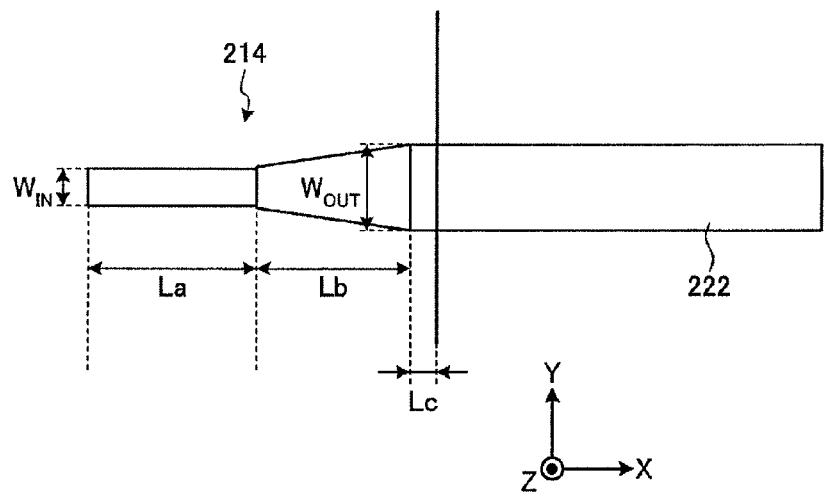
FIG. 5 is a plan view showing an example of mounting the semiconductor laser device.
Figure 6:
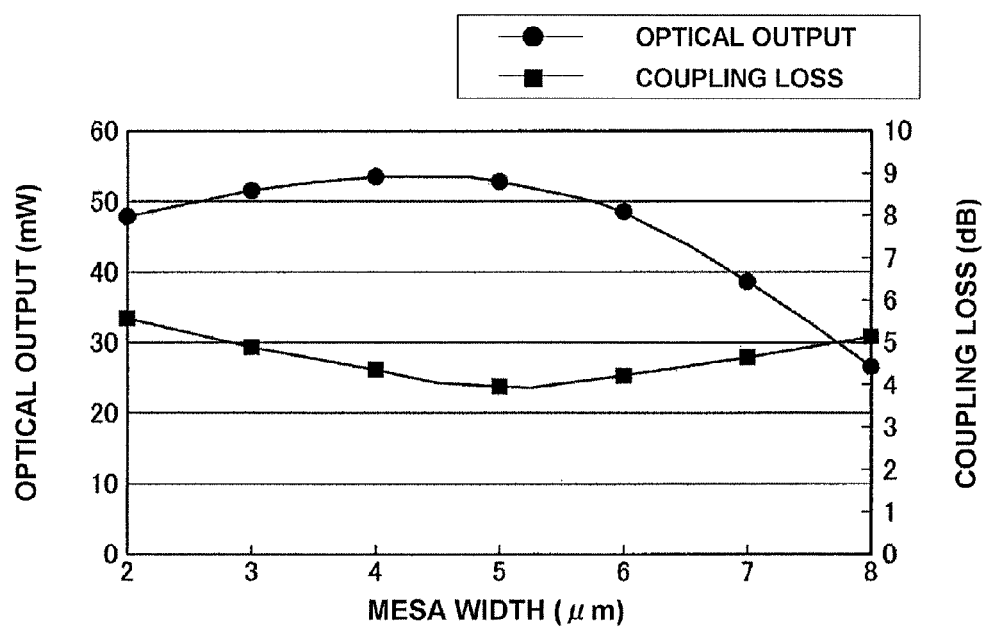
FIG. 6 is a graph showing a relation between mesa width of an output end of the semiconductor laser device and optical output and coupling loss.

Specifically, when the PLC MZI light selecting device is used as the light selecting device unit 22, as shown in FIG. 5, the mesa width of the semiconductor laser device 214 is set to expand near the output end from a mesa width $W_{IN}$ to a mesa width $W_{OUT}$ to make a flare shape or a taper shape, such that the mesa width at the end of the flare shape matches the mesa width of the optical waveguide 222. With this configuration, it is possible to increase the output of the laser itself, and further reduce the coupling loss with the optical waveguide 222. FIG. 6 is a graph showing a relation between the mesa width $W_{OUT}$ of the output end of the semiconductor laser device 214 and the optical output and coupling loss. As shown in FIG. 6, if the mesa width $W_{OUT}$ of the output end of the semiconductor laser device 214 is increased from 2 micrometers to 5 micrometers, when the cavity length of the laser is 500 micrometers and the driving current is 250 milliamperes, it is possible to increase the optical output up to 110% and to reduce the coupling loss from 5.6 dB to 3.9 dB.

Figure 7:
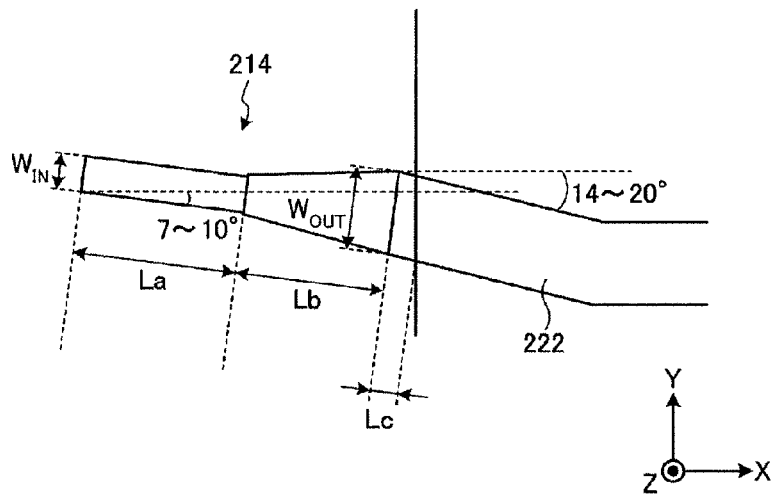
FIG. 7 is a plan view showing a modification example of mounting the semiconductor laser device.

In this case, it is desirable to match the core width of the optical waveguides 222 with the mesa width $W_{OUT}$ of the output end of the semiconductor laser device 214. In addition, in order to reduce a radiation loss at the flare portion (or the taper portion), it is desirable that a length Lb of the SSC satisfy following Expression (4). Furthermore, in order to reduce the reflection of the laser light at the output facet and to suppress the coupling loss, as shown in FIG. 7, it is desirable to tilt the output facet of the semiconductor laser device 214 by 7 degrees to 10 degrees and the optical waveguide 222 by 14 degrees to 20 degrees.

$$Lb/(0.5\times(W_{OUT}-W_{IN}))<\tan(7\pi/180) \quad (4)$$

Figure 8:
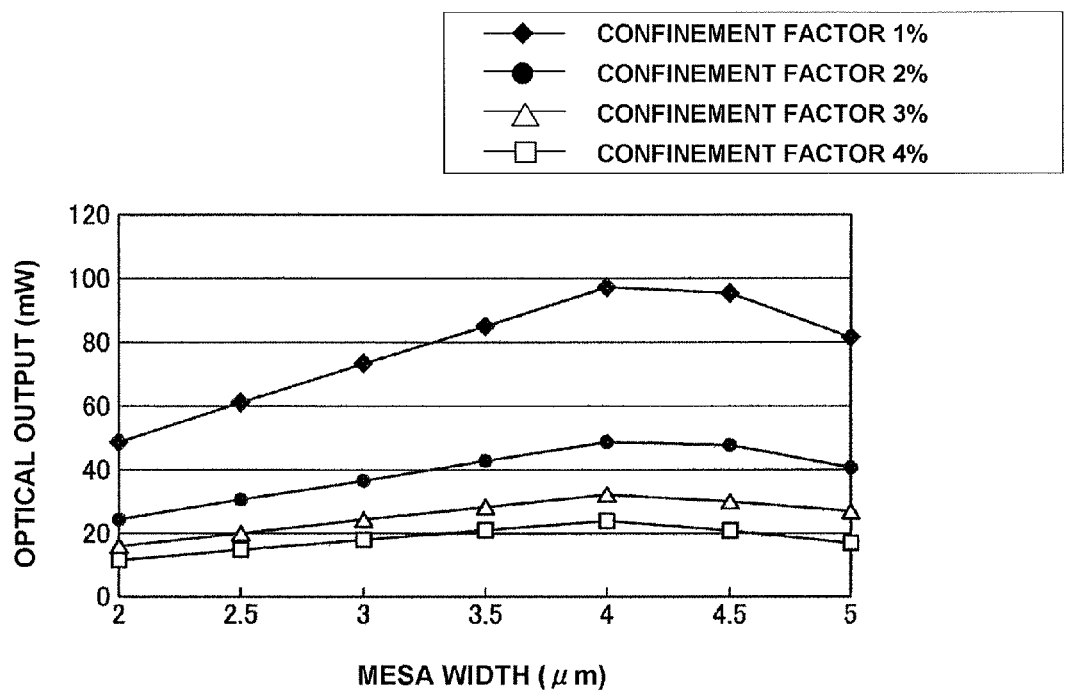
FIG. 8 is a graph showing a change of the relation between the mesa width of the output end of the semiconductor laser device and the optical output with a change of a confinement factor of a semiconductor optical amplifier (SOA)
Figure 9:
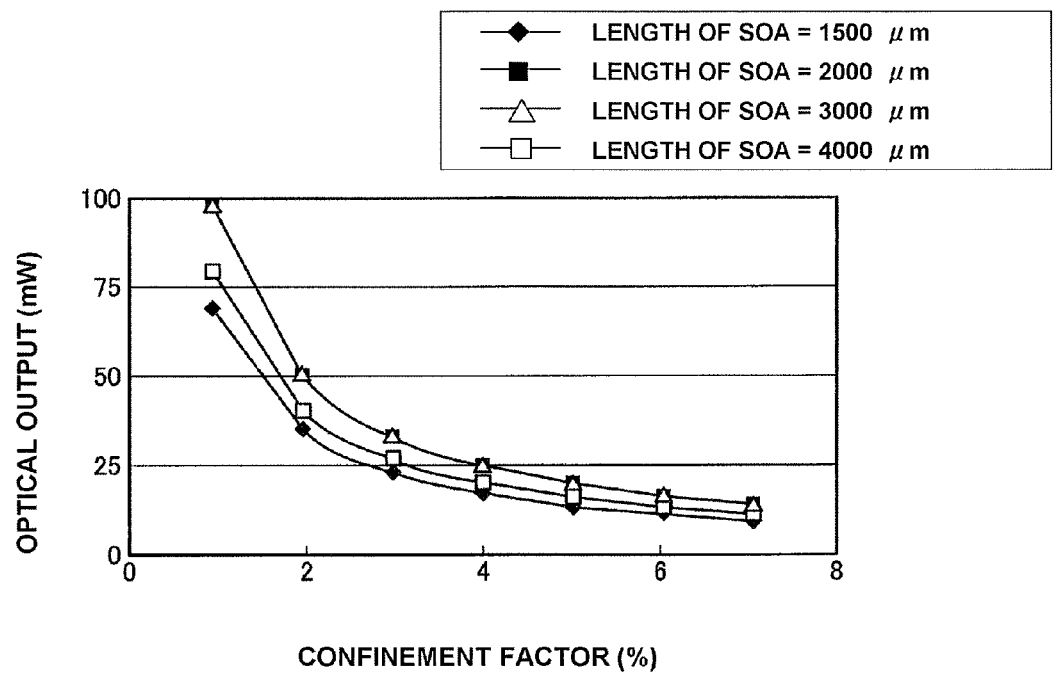
FIG. 9 is a graph showing a change of a relation between the confinement factor of the SOA and the optical output with a change of a gain length of the SOA.

According to the characteristics shown in FIG. 6, when the mesa width is in a range between 2.5 micrometers and 5.5 micrometers approximately and the driving current is 250 milliamperes, the optical output becomes 50 milliwatts or higher. More preferably, when the mesa width is in a range between 3.5 micrometers and 5 micrometers approximately, the optical output is virtually maximized with the same driving current. When such optical output is coupled to the optical waveguides 222, it leads to an input of a light of about 50 milliwatts or higher to the SOA 233. Therefore, it is desirable to set the confinement factor, the mesa width, and the gain length (SOA length) of the SOA 233 such that an output of the SOA 233 is not saturated with such a high optical input. Specifically, the optical output varies according to the confinement factor and the mesa width of the SOA 233 as shown in FIG. 8. Furthermore, the optical output varies according to the confinement factor and the gain length of the SOA 233 as shown in FIG. 9. That is, the gain is positive when the confinement factor of the SOA 233 is in a range from 1% to 2%, where a high optical output can be obtained. For this reason, it is desirable that the confinement factor of the SOA 233 be in a range from 1% to 2% in order to obtain the high optical output.

Figure 10:
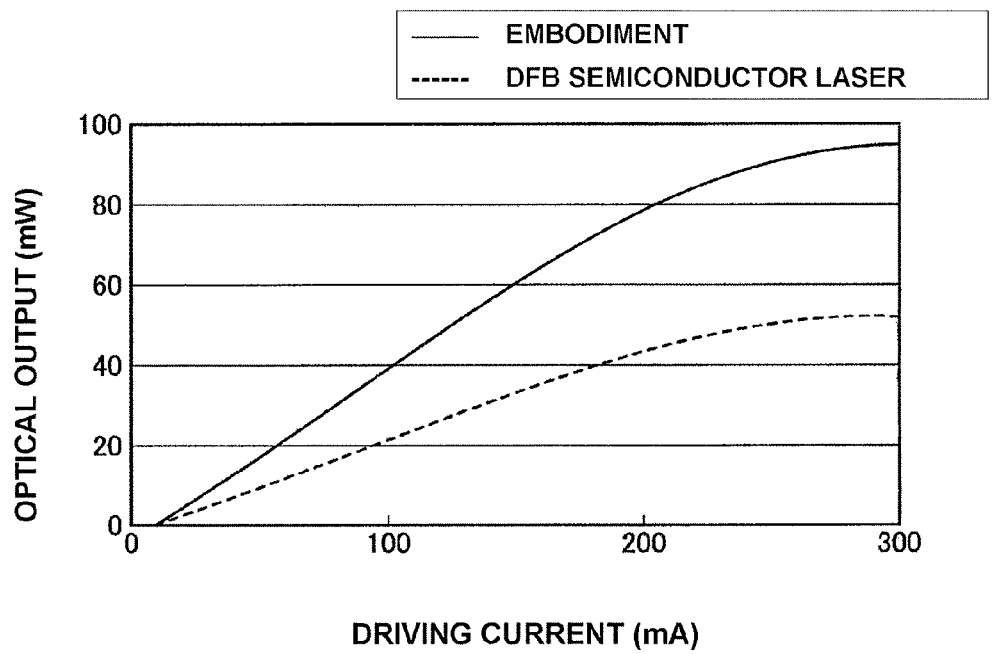
FIG. 10 is a graph showing a relation between driving current and the optical power in the semiconductor laser module according to the present invention employing the DR semiconductor laser devices and in a semiconductor laser module employing the DFB semiconductor laser devices.

Lastly, a result of evaluating the relation between the driving current and the optical output is presented for a semiconductor laser module according to an embodiment of the present invention employing the DR semiconductor laser devices and the light selecting device and a semiconductor laser module employing the 2/π phase-shifted DFB semiconductor laser devices and the MMI optical coupler. FIG. 10 is a graph showing the relation between the driving current and the optical output of the semiconductor laser module according to the embodiment of the present invention and the semiconductor laser module employing the DFB semiconductor laser devices and the MMI optical coupler. As is clear from FIG. 10, it is possible to improve the optical output characteristic by about 80% with the semiconductor laser module according to the embodiment of the present invention, compared to the semiconductor laser module employing the DFB semiconductor laser devices. In addition, it is possible to reduce the optical spectral linewidth to ⅕ of that of the DFB semiconductor laser device.

As described above, the semiconductor laser module 2 according to the embodiment of the present invention includes the semiconductor laser substrate 212 including the DR semiconductor laser devices 214 each emitting a laser light in a forward direction and the light selecting device unit 22 that is optically coupled to the semiconductor laser devices 214, which selectively outputs a laser light emitted from one of the semiconductor laser devices 214.

With the semiconductor laser module according to the embodiment of the present invention, the semiconductor laser device is made up with the DR semiconductor laser device 214 that outputs substantially all output power from the front facet on the output direction side shown in FIGS. 3 and 4, it is possible to obtain a high output power from the entire module, compared to a case of employing the DFB semiconductor laser devices that outputs about a half of the output power from the rear facet. In addition, because the light selecting device unit 22 selectively outputs a laser light from the semiconductor laser devices 214, it is possible to reduce the insertion loss between the semiconductor laser devices 214 and the SOA 233, compared to a case of employing the MMI optical coupler. With this configuration, it is possible to achieve the high efficiency and the high output power from the semiconductor laser module according to the embodiment of the present invention.

As described above, according to an embodiment of the present invention, because the semiconductor laser devices are DR semiconductor laser devices that output virtually all output power from the front facets and the light selecting device selectively outputs one of the laser lights emitted from the DR semiconductor laser devices, the laser light is output from the output facet of the SOA without having an optical loss such as the optical loss at the MMI optical coupler, which makes it possible to realize the high efficiency and the high output power in the entire semiconductor laser module. With the configuration employing the light selecting device, there is no decrease of the optical output, compared to a case of employing the MMI optical coupler, and an improvement of the output of each semiconductor laser device due to the introduction of the DR structure considerably contributes to an improvement of the optical output of the entire module.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor laser module, comprising:
a semiconductor laser unit including
a semiconductor laser substrate, and
a plurality of distributed reflector (DR) semiconductor laser devices formed on the semiconductor laser substrate in an array, each of the DR semiconductor laser devices being configured to emit laser light of a different wavelength from an output facet and including an antireflection film on the output facet, a high-reflection film on a rear facet opposite to the output facet, an active area on a side of the antireflection film, and a passive area on a side of the high-reflection film; and
a light selecting unit including
a light selecting device substrate, and
a planar lightwave circuit Mach-Zehnder interferometer (PLC-MZI) light selecting device formed on the light selecting device substrate, the PLC-MZI light selecting device being configured to selectively output the laser light emitted from each of the DR semiconductor laser devices, wherein
the semiconductor laser unit and the light selecting unit are attached to each other in such a manner that the PLC-MZI light selecting device is optically coupled to the DR semiconductor laser devices.

2. The semiconductor laser module according to claim 1, wherein the semiconductor laser unit and the light selecting unit are attached to each other with a resin that is transparent to a wavelength band of the laser light.

3. The semiconductor laser module according to claim 1, wherein
each of the DR semiconductor laser devices further includes a spot size converter of a flare type or a taper type.

4. The semiconductor laser module according to claim 1, further comprising an amplifying unit including
an amplifier substrate, and
a semiconductor optical amplifier formed on the amplifier substrate, the semiconductor optical amplifier being configured to amplify the laser light selectively output by the PLC-MZI light selecting device, wherein
the light selecting unit and the amplifying unit are attached to each other in such a manner that the semiconductor optical amplifier is optically coupled to the PLC-MZI light selecting device.

5. The semiconductor laser module according to claim 4, wherein the light selecting unit and the amplifying unit are attached to each other with a resin that is transparent to a wavelength band of the laser light.

6. The semiconductor laser module according to claim 4, wherein a confinement factor of the semiconductor optical amplifier is in a range from 1% to 2%.

7. The semiconductor laser module according to claim 4, wherein
the semiconductor laser unit further includes a first temperature control device on which the semiconductor laser substrate is attached,
the amplifying unit further includes a second temperature control device on which the amplifier substrate is attached, and
the first temperature control device and the second temperature control device are configured to respectively control temperatures of the DR semiconductor laser devices and the semiconductor optical amplifier independently of each other.

8. The semiconductor laser module according to claim 4, wherein
each of the DR semiconductor laser devices further includes a spot size converter of a flare type or a taper type.

9. An optical module, comprising:
a semiconductor laser module configured to emit laser light;
a collimating lens configured to collimate the laser light emitted from the semiconductor laser module;
a focusing lens configured to focus the laser light collimated by the collimating lens; and
an optical fiber optically coupled to the focusing lens and configured to propagate the laser light focused by the focusing lens, wherein
the semiconductor laser module includes
a semiconductor laser unit including
a semiconductor laser substrate, and
a plurality of distributed reflector (DR) semiconductor laser devices formed on the semiconductor laser substrate, each of the DR semiconductor laser devices being configured to emit laser light of a different wavelength from an output facet and including an antireflection film on the output facet, a high-reflection film on a rear facet opposite to the output facet, an active area on a side of the antireflection film, and a passive area on a side of the high-reflection film, and
a light selecting unit including
a light selecting device substrate, and
a planar lightwave circuit Mach-Zehnder interferometer (PLC-MZI) light selecting device formed on the light selecting device substrate, the PLC-MZI light selecting device being configured to selectively output the laser light emitted from each of the DR semiconductor laser devices, and
the semiconductor laser unit and the light selecting unit are attached to each other in such a manner that the PLC-MZI light selecting device is optically coupled to the DR semiconductor laser devices.

10. The optical module according to claim 9, wherein the semiconductor laser unit and the light selecting unit are attached to each other with a resin that is transparent to a wavelength band of the laser light.

11. The optical module according to claim 9, wherein
each of the DR semiconductor laser devices further includes a spot size converter of a flare type or a taper type.

12. The optical module according to claim 9, wherein the semiconductor laser module further includes an amplifying unit including
an amplifier substrate, and
a semiconductor optical amplifier formed on the amplifier substrate, the semiconductor optical amplifier being configured to amplify the laser light selectively output by the PLC-MZI light selecting device, wherein the light selecting unit and the amplifying unit are attached to each other in such a manner that the semiconductor optical amplifier is optically coupled to the PLC-MZI light selecting device.

13. The optical module according to claim 12, wherein the light selecting unit and the amplifying unit are attached to each other with a resin that is transparent to a wavelength band of the laser light.

14. The semiconductor laser module according to claim 12, wherein a confinement factor of the semiconductor optical amplifier is in a range from 1% to 2%.

15. The optical module according to claim 12, wherein
the semiconductor laser unit further includes a first temperature control device on which the semiconductor laser substrate is bonded,
the amplifying unit further includes a second temperature control device on which the amplifier substrate is bonded, and
the first temperature control device and the second temperature control device are configured to respectively control temperatures of the DR semiconductor laser devices and the semiconductor optical amplifier independently of each other.

16. The semiconductor laser module according to claim 12, wherein
each of the DR semiconductor laser devices further includes a spot size converter of a flare type or a taper type.

17. The optical module according to claim 1, wherein the PLC-MZI light selecting device is configured as an n input-to-1 output planar lightwave circuit, where n is a number of the DR semiconductor laser devices.

18. The semiconductor laser module according to claim 1, wherein
the light selecting unit further includes a plurality of optical waveguides configured to guide the laser light from the DR semiconductor laser devices,
the PLC-MZI light selecting device includes a plurality of MZI devices, and
each of the MZI devices is optically coupled to two adjacent optical waveguides and configured to selectively output the laser light guided through one of the two adjacent optical waveguides.

19. The optical module according to claim 9, wherein the PLC-MZI light selecting device is configured as an n input-to-1 output planar lightwave circuit, where n is a number of the DR semiconductor laser devices.

20. The optical module according to claim 9, wherein
the light selecting unit further includes a plurality of optical waveguides configured to guide the laser light from the DR semiconductor laser devices,
the PLC-MZI light selecting device includes a plurality of MZI devices, and
each of the MZI devices is optically coupled to two adjacent optical waveguides and configured to selectively output the laser light guided through one of the two adjacent optical waveguides.

\* \* \* \* \*